United States Patent
Li et al.

(10) Patent No.: US 6,503,314 B1
(45) Date of Patent: Jan. 7, 2003

(54) MOCVD FERROELECTRIC AND DIELECTRIC THIN FILMS DEPOSITIONS USING MIXED SOLVENTS

(75) Inventors: Tingkai Li, Vancouver, WA (US); Wei Wei Zhuang, Vancouver, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 66 days.

(21) Appl. No.: 09/649,381

(22) Filed: Aug. 28, 2000

(51) Int. Cl.[7] .............................. C23L 14/12; C09K 3/00
(52) U.S. Cl. ................................. 106/287.19; 427/585
(58) Field of Search ...................... 106/287.19; 427/585

(56) References Cited

U.S. PATENT DOCUMENTS

| | | | | |
|---|---|---|---|---|
| 5,225,561 A | | 7/1993 | Kirlin et al. ................. | 546/256 |
| 5,453,494 A | | 9/1995 | Kirlin et al. .................. | 534/15 |
| 5,783,716 A | * | 7/1998 | Baum et al. ................. | 427/587 |
| 5,820,664 A | | 10/1998 | Gardiner et al. ........ | 106/287.17 |
| 6,010,744 A | * | 1/2000 | Buskirk et al. ......... | 427/255.31 |
| 6,190,925 B1 | * | 2/2001 | Li et al. ........................ | 438/3 |
| 2001/0024835 A1 | * | 9/2001 | Li et al. ........................ | 438/3 |
| 2002/0018904 A1 | * | 2/2002 | Li et al. ...................... | 428/469 |

OTHER PUBLICATIONS

Article entitled, "In-situ Low Temperature Growth and Orientation Control in MOCVD PZT/RuO$_2$ Thin Film Heterostructures on SiO$_2$/Si Substrates" by G.R. Bai, A. Wang, I.-F. Tsu, C.M. Foster and O. Auciello, published in Integrated Ferroelectrics, vol. 21, pp. 291–304 (1993) No month provided.

Article entitled, "Effects of La and Nb Modification on the Electricql Properties of Pb(Zr,Ti)O$_3$ Thin Films by MOCVD", by M. Shimizu, H. Fujisawa and T. Shiosake, Published in Integrated Ferroelectrics, vol. 14, pp. 69–75 (1997) No month provided.

Article entitled, "Liquid Delivery MOCVD of Niobium–Doped Pb(Zr,Ti)O$_3$ Using a Novel Niobium Precursor", by I.-S. Chen, J. F. Roeder, T. E. Glassman and T. H. Baum, published in Chemical Material, 11 No. 2, pp. 209–212 (1999) No month provided.

Article entitled, "Liquid Delivery MOCVD of Ferroelectric PZT" by J. F. Roeder, B. A. Vaartstra, P. C. VanBuskirk and H. R. Beratan, published in Mat. Res. Soc. Symp. Proc. 415, pp. 123–128 (1996) No month provided.

* cited by examiner

*Primary Examiner*—David Brunsman
(74) *Attorney, Agent, or Firm*—David C. Ripma; Matthew D. Rabdau; Scott C. Krieger (57) ABSTRACT

A ferroelectric and dielectric source solution for use in chemical vapor deposition processes includes a ferroelectric/dielectric chemical vapor deposition precursor; and a solvent for carrying the ferroelectric/dielectric chemical vapor deposition precursor taken from the group of solvents consisting essentially of type A solvents, including tetraglyme, triglyme, triethylenetetramine, N,N,N',N'-tetramethylethylenediamine; N,N,N',N',N",N"-pentamethyldiethylenetriamine; and 2,2'-bipyridine; type B solvents including tetrahydrofuran, butyl ethyl ether, tert-butyl ethyl ether, butyl ether, and pentyl ether; and type C solvents including iso-propanol, 2-butanol, 2-ethyl-1-hexanol, 2-pentanol, toluene, xylene and butyl acetate; and mixtures of solvent types A, B and C.

11 Claims, 10 Drawing Sheets

SOLVENT I

SOLVENT II

SOLVENT III

MOCVD FERROELECTRIC AND DIELECTRIC THIN FILMS DEPOSITIONS USING MIXED SOLVENTS

FIELD OF THE INVENTION

This invention relates to processes and fabrication of memory devices, and specifically to a method of depositing ferroelectric and dielectric thin films, such as $PbZr_xTi_{1-x}O_3$ (PZT), $SrBi_2Ta_2O_9$(SBT), $Ba_{1-x}Sr_xTiO_3$ (BST) and $Pb_5Ge_3O_{11}$ (PGO), using ferroelectric and dielectric solutions in liquid-delivery metal organic chemical vapor deposition (MOCVD) techniques.

BACKGROUND OF THE INVENTION

Liquid delivery MOCVD processes have been used for deposition of ferroelectric and dielectric thin films. Compared with solid source techniques, the advantages of using liquid source for MOCVD are well known and include achieving homogeneity at an atomic level in a solution, which leads to accurate control of the stoichiometry of the deposited films, which have, when using single source techniques, complex compositions. Because the chemical reactants for a liquid source may be purified conveniently by distillation and crystallization, films of high purity may be fabricated by liquid-delivery MOCVD processing. Another advantage of liquid source delivery is that liquid source materials are easy to transport from a source container to a vaporizer, and may be accurately infused into the reaction chamber using a liquid flow meter. Liquid source materials may be atomized to increase evaporation area, which will increase evaporation amount and promote the complete evaporation of the liquid source material. However, because liquid-delivery MOCVD techniques are relatively new commercial technologies, there are still many problems to be dealt with, including those related to surface roughness, surface morphologies and properties of ferroelectric and dielectric thin films deposited by the liquid-delivery MOCVD techniques. In liquid-delivery MOCVD processes, solvents are used to dissolve precursors, to transport the precursors from a source container to a vaporizer, and to promote atomization of the precursors, resulting in complete evaporation of the precursor.

Because the solvents are introduced into a MOCVD reactor, and join in the precursor reactions and film depositions, the solvents have a significant effect on the film qualities, such as surface roughness, morphology and other properties. Selection of solvents is an important decision when using MOCVD techniques for ferroelectric and dielectric thin film deposition. In spite of the importance of solvent selection, most known research has been directed towards selection of precursors, with only a minor amount of research being directed towards solvents selection for MOCVD processes.

The challenge of preparing PZT ferroelectric metal oxide thin films via MOCVD methods are described in G.-R. Bai, A. Wang, I.-F. Tsu, C. M. Foster, and O. Auciello, *Integrated Ferroelectrics,* Vol. 21, 291(1998); M. Shimizu, H. Fujisawa and T. Shiosaki, *Integrated Ferroelectrics,* Vol. 14, 69(1997); and U.S. Pat. No. 5,453,494 to Kirlin et al., for *Metal complex source reagents for MOCVD,* granted Sept. 26, 1995.

U.S. Pat. No. 5,820,664 to Gardiner et al., for Precursor compositions for chemical vapor deposition, and ligand exchange resistant metal-organic precursor solutions comprising same, granted Oct. 13, 1998, describes the difficulties in this area related to the various precursors which must be used.

Currently, $Pb(TMH)_2$ is an accepted lead precursor, however, its low volatility and poor stability renders its application in MOCVD difficult, as described in I.-S. Chen, J. F. Roeder, T. E. Glassman, and T. H. Baum, Chem. Mater., 11 No. 2, 209 (1999). With the introduction of a liquid-delivery system, the delivery of precursors is greatly improved, but there are still many problems, as described in J. F. Roeder, B. A. Vaartstra, P. C. Van Buskirk, and H. R. Beratan, Mater. Res. Soc. Symp. Proc. 415, 123 (1996).

The key problems are the precursor's stability and volatility, the solution reactions in PZT precursor solutions, the precursor's solubility, the precursor's decomposition tendency in the heated delivery line, the purity of the precursor solutions, and the block of the delivery line and the vaporizer. To solve these problems, the use of different precursors is necessary. The existing precursor solution is the combination of tetrahydrofunan (TBF) and tetraglyme and iso-propanol, in which the solid ferroelectric precursors are dissolved.

SUMMARY OF THE INVENTION

A ferroelectric and dielectric source solution for use in chemical vapor deposition processes includes ferroelectric and dielectric chemical vapor deposition precursors; and a solvent for carrying the ferroelectric/dielectric chemical vapor deposition precursors taken from the group of solvents consisting essentially of type A solvents, including tetraglyme, triglyme, triethylenetetramine, N,N,N',N'-tetramethylethylenediamine; N,N,N',N',N",N"-pentamethyldiethylenetriamine; and 2,2'-bipyridine; type B solvents including tetrahydrofuran, butyl ethyl ether, tert-butyl ethyl ether, butyl ether, and pentyl ether; and type C solvents including iso-propanol, 2-butanol, 2-ethyl-1-hexanol, 2-pentanol, toluene, xylene and butyl acetate; and mixtures of solvent types A, B and C.

An object of the invention is to develop optimum liquid-delivery MOCVD processes for ferroelectric and dielectric thin film deposition using mixed solvents.

Another object of the invention is to improve the surface roughness, surface morphology and ferroelectric/dielectric properties of the deposited film using the mixed solvents.

A further object of the invention is to provide a precursor solution which is stable, i.e., does not precipitate, when stored for an extended period of time.

Another object of the invention is to provide a solution having metal β-diketone solid precursors dissolved in a precursor solution wherein the metal concentration remains nearly constant during extended storage.

Yet another object of the invention is to provide a precursor solution which yields deposited metal oxide ferroelectric and dielectric thin films having good ferroelectric and dielectric properties, respectively.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS OF THE INVENTION

The invention provides a method to smooth the surface roughness, surface morphology and properties of ferroelectric and dielectric, such as oxide, thin films using mixed solvents. In liquid-delivery metal organic chemical vapor deposition (MOCVD) systems, solvents are used to dissolve precursors, transport the precursors from a source container to a vaporizer, to assist in the atomization of precursors and make them complete evaporation. The solvents are also introduced into a MOCVD reactor and join the precursor reactions and film depositions.

In general, a solvent should have following properties: high solubility power; no interaction between precursor and solvent when they are mixed, i.e., long term stability; they should not participate in a reaction, other than to provide a dilution effect; they should have an appropriate boiling point, close to the vaporization temperature of the precursors; they should have low viscosity; and they should be inexpensive.

The solvents which may be used during deposition of typical thin films are listed in Table 1. The precursors are listed in Table 2.

TABLE 1

Solvent Properties and Classification

| Organic Stabilizer | Boiling Point (° C.) | Formula |
|---|---|---|
| Type A Solvent: strong coordinated to the metal center, stabilize the metal organic precursors in their gas phases. | | |
| Tetraglyme | 275 | $CH_3(OCH_2CH_2)_4OCH_3$ |
| Triglyme | 216 | $CH_3(OCH_2CH_2)_3OCH_3$ |
| Triethylenetetramine | 266 | $H_2N(CH_2CH_2NH)_2CH_2CH_2NH_2$ |

TABLE 1-continued

Solvent Properties and Classification

| Organic Stabilizer | Boiling Point (° C.) | Formula |
|---|---|---|
| N,N,N',N'-tetramethylethylenediamine | 121 | $(CH_3)_2NCH_2CH_2N(CH_3)_2$ |
| N,N,N',N',N",N"-pentamethyldiethylenetriamine | 198 | $[(CH_3)_2NCH_2CH_2]_2NCH_3$ |
| 2,2'-bipyridine | 273 | $(NC_5H_4)_2$ |
| Type B Solvent: dissolves metal organic precursors to give liquid precursors which can be applied in liquid-delivery system for MOCVD metal oxide thin film deposition | | |
| Tetrahydrofuran | 65–67 | $C_4H_8O$ |
| Butyl ethyl ether | 92 | $CH_3(CH_2)_3OC_2H_5$ |
| tert-butyl ethyl ether | 73 | $(CH_3)_3COC_2H_5$ |
| Butyl ether | 142–143 | $[CH_3(CH_2)_3]O$ |
| Pentyl ether | 187 | $[CH_3(CH_2)_4]O$ |
| Type C Solvent: alcohols for liquid precursor property adjustment | | |
| iso-propanol | 97 | $(CH_3)_2CHOH$ |
| 2-butanol | 98 | $C_2H_5CH(OH)CH_3$ |
| 2-ethyl-1-hexanol | 183–186 | $CH_3(CH_2)_3CH(C_2H_5)CH_2OH$ |
| 2-pentanol | 118 | $CH_3CH_2CH_2CH(OH)CH_3$ |
| Toluene | 111 | $C_6H_5CH_3$ |
| Xylene | 137–144 | $C_6H_4(CH_3)_2$ |
| Butyl Acetate | 124–126 | $C_6H_{12}O_2$ |

TABLE 2

The properties of precursors for ferroelectric and dielectric (oxide) thin films

| Precursor | Formula | Appearance at Room Temperature | Moisture stability | Vapor Pressure (mm Hg) | Decomposition Temp (° C.) |
|---|---|---|---|---|---|
| $Ba(TMHD)_2$ | $Ba(C_{11}H_{19}O_2)_2$ | white powder | sensitive | 225° C./0.05 | 285° C. |
| Bi Triphenyl | $Bi(C_6H_5)_3$ | white crystal | stable | 100° C./0.2 | 310° C. |
| $Ge(OEt)_4$ | $Ge(OC_2H_5)_4$ | colorless liquid | sensitive | 185° C. | |
| $La(TMHD)_3$ | $La(C_{11}H_{19}O_2)_3$ | white powder | | 210° C./0.2 | 370° C. |
| $Nb(OEt)_5$ | $Nb(OC_2H_5)_5$ | yellow liquid | sensitive | 145° C./0.1 | 350° C. |
| Pb Tetraphenyl | $Pb(C_6H_5)_4$ | white powder | | 230° C./0.05 | 325° C. |
| $Pb(TMHD)_2$ | $Pb(C_{11}H_{19}O_2)_2$ | white powder | | 180° C./0.05 | 325° C. |
| $Sr(TMHD)_2$ | $Sr(C_{11}H_{19}O_2)_2$ | light yellow powder | stable | 230° C./0.05 | 250° C. |
| $Ta(OEt)_4$ | $Ta(OC_2H_5)_5$ | yellow liquid | sensitive | 145° C./0.1 | 350° C. |
| $Ti(OEt)_4$ | $Ti(OC_2H_5)_4$ | colorless xtl. | sensitive | 138° C./5 | |
| $Ti(POr^r)_4$ | $Ti(OC_3H_7)_4$ | colorless liquid | sensitive | 58° C./1 | |
| $Zr(TMHD)_4$ | $Zr(C_{11}H_{19}O_2)_4$ | white crystal | | 180° C./0.1 | |
| $Zr(OBu^t)_4$ | $Z(OC_4H_9)_4$ | yellow liquid | sensitive | 90° C./5 | |

Liquid solvents for metal organic precursor may be obtained using combinations of the three different organic solvent types, selected from each type A, type B and type C, respectively. From Tables 1 and 2, it may be seen that most solvents have boiling points which are lower than the vaporization temperature of the precursors to be dissolved in the solvents; therefore, in order to obtain appropriate boiling points, mixtures of various solvents must be used. This invention describes the use of mixed solvents. Exemplary compositions of the kinds of solvents are as follows:

Solvent I: Molar ratio of tetrahydrofuran, iso-propanol and tetraglyme of about 6–10:1–4:1, preferably of about 8:2:1.
Solvent II: Molar ratio of butyl ether, iso-propanol and tetraglyme of about 6–10:1–4:1, preferably of about 8:2:1.
Solvent III: Molar ratio of butyl ether, tetrahydrofuran, iso-propanol and tetraglyme of about 3–5:3–5:1–4:1, preferably of about 4:4:2:1.
Solvent IV: Molar ratio of butyl ether and tetraglyme: 8:1.

The general solvent composition is a mixture of a solvent of type B, type C and type A in a molar ration of about 6–10:1–4: and preferably about 8:2:1; or a mixture of a solvent of type B and type A in a molar ration of about 6–10:1–3, and preferably about 8:1.

An Emcore oxide MOCVD reactor, having a liquid-delivery system, is used for the growth of PZT thin films. The precursors for ferroelectric and dielectric thin films are as listed in Table 2. $Pb(TMHD)_2$, $Z(TMHD)_4$ and $Ti(OPr_1)_4$, where THMD is 2,2,6,6-tetramethyl-3,5-heptanedionate and $OPr^i$ is iso-protoxide, in a molar ratio of about 1.2:0.5:0.5 are dissolved into mixed solvents I–III. The precursor solutions have a concentration of 0.1 M/L of PZT. The solution is injected into a vaporizer at a temperature of about 200° C.–250° C. and a pump at a rate of 0.1–0.5 ml/min, to form precursor gases. The precursor gases are brought into the MOCVD reactor using a preheated argon flow at 200° C.–250° C. The deposition temperatures and pressure are 500° C.–650° C. and 10 Torr, respectively. The shroud flow, Ar at 4000 sccm, with oxygen at 1000–2500 sccm, is fed into the reactor. After deposition, the PZT thin films are cooled to room temperature in a oxygen atmosphere. In order to improve the ferroelectric properties of PZT thin films, the as-deposited PZT thin films may be annealed at 600° C.–700° C., in an oxygen atmosphere before and after top electrode deposition.

Figure 1:
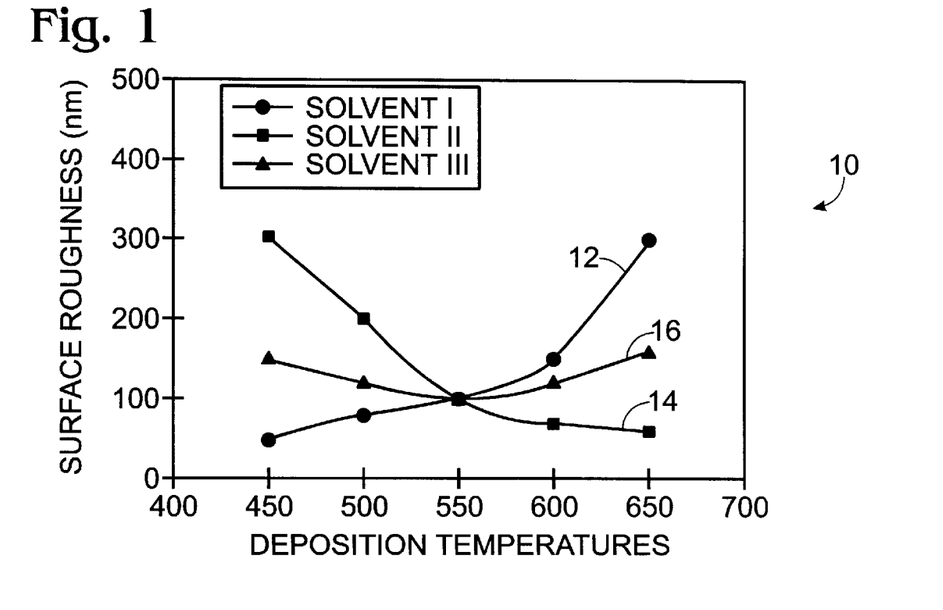
FIG. 1 depicts the surface roughness of PZT thin films using mixed solvents.

FIG. 1 depicts the surface roughness of PZT thin films at various deposition temperatures using the mixed solvents I–III, generally at 10. Using solvent I, trace 12, lower surface roughness was found at lower deposition temperature, while the surface roughness increased as deposition temperatures increased. Solvent II, trace 14, produced a PZT layer wherein the surface roughness was higher at lower deposition temperature, and smoothed as deposition temperatures increased. Solvent III, trace 16, is a mixed solvent of solvent I and solvent II. As shown in FIG. 1, the surface roughness may be controlled by using solvent III, and adjusting the ratio of solvent I solvent II. Therefore, the surface roughness of ferroelectric and dielectric thin films deposited at different temperatures may be improved by selection and mixing of various solvents.

Figure 2:
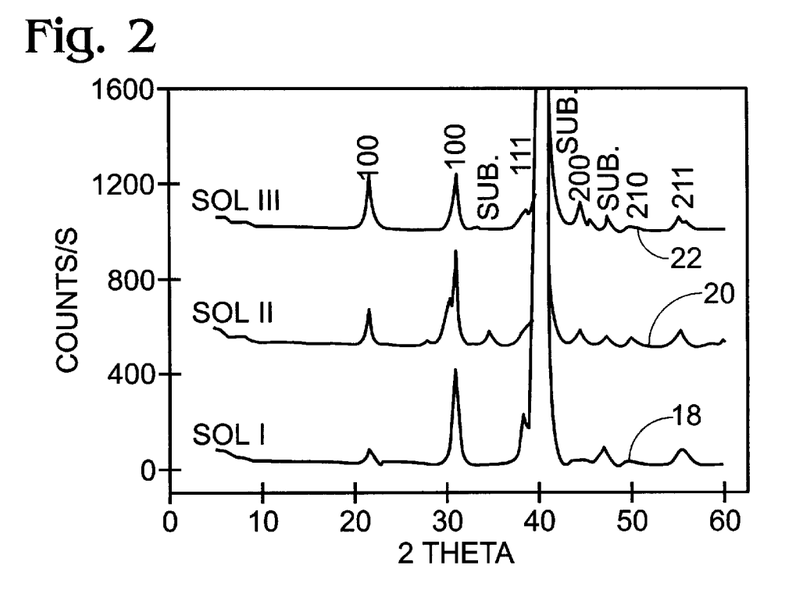
FIG. 2 depicts X-ray patterns of PZT thin films on Pt/Ir electrodes using mixed solvents.

FIG. 2 depicts X-ray patterns of PZT thin films on Pt/Ir electrodes using A, mixed solvents, wherein trace 18 is obtained using solvent I, trace 20 is obtained using solvent II, and trace 22 is obtained using solvent III. The preferred orientation of PZT thin films may be adjusted using various mixtures of solvents. The X-ray patterns show that the (100) orientation of PZT thin films tend to be strongest using solvent III, as trace 22 has a broader 2-theta value for the 100 orientation.

Figure 3:
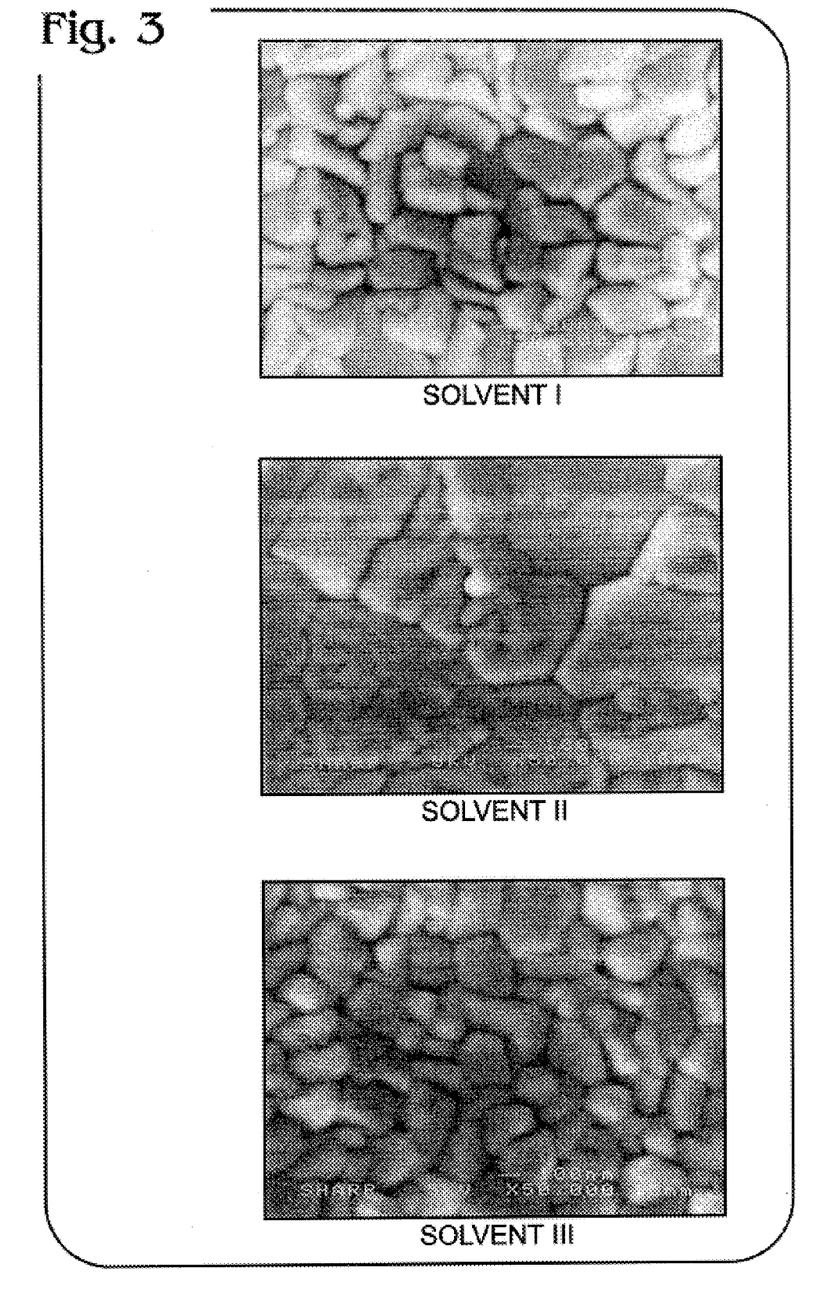
FIG. 3 depicts the microstructures of PZT thin films on Pt/Ir electrodes using mixed solvents.

FIG. 3 depicts the microstructures of PZT thin films on Pt/Ir electrodes using mixed solvents I–III. The surface morphologies may also be changed using various mixed solvents of the invention. Smaller grains are found in PZT thin films deposited using solvents I and III. Dense PZT thin films, with large plate shape grains, are obtained using solvent II, which thin film subsequently demonstrated excellent ferroelectric properties.

Figure 4A:
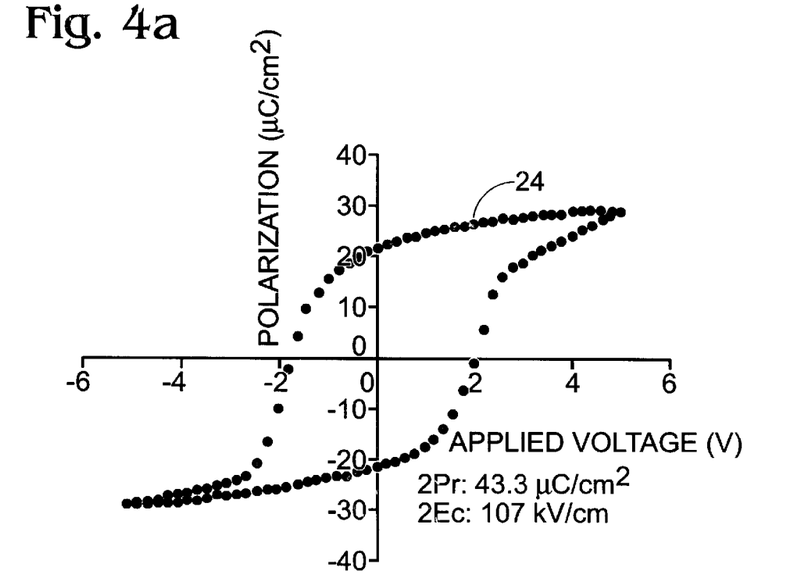
FIG. 4a,b are the hysteresis loops of PZT thin film on Pt/Ir electrodes using solvent I.
Figure 4B:
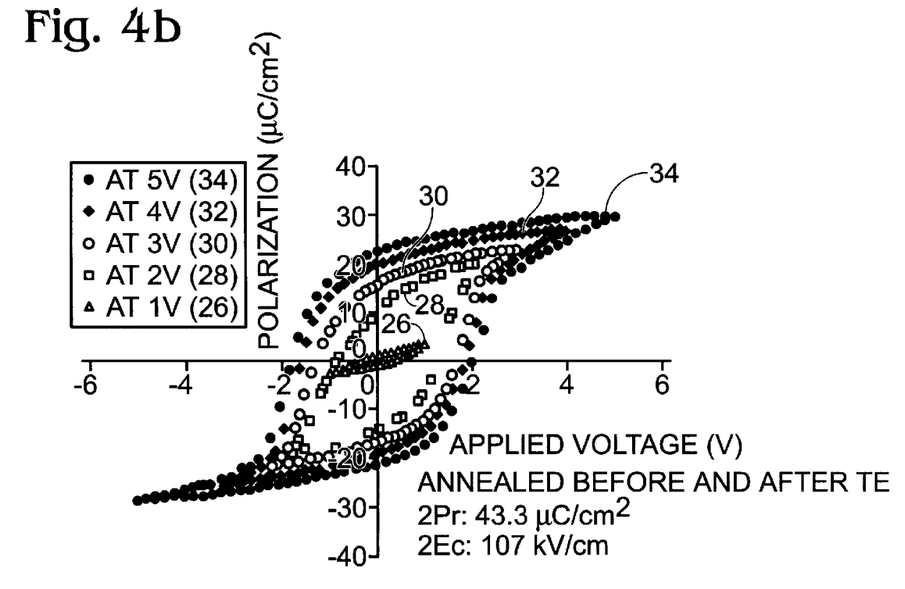
Figure 5A:
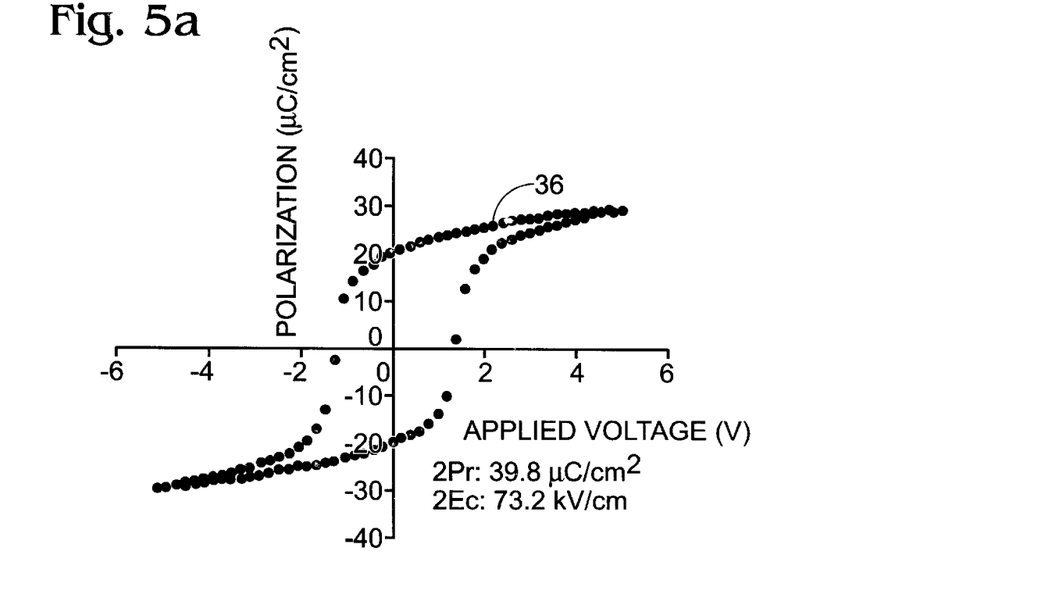
FIG. 5a,b are the hysteresis loops of PZT thin film on Pt/Ir electrodes using solvent II.
Figure 5B:
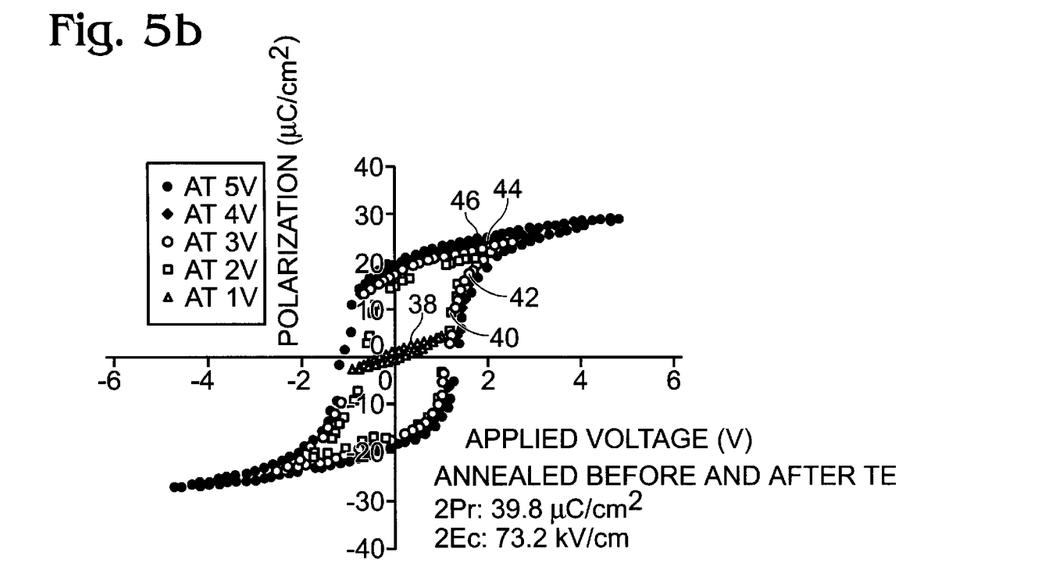
Figure 6A:
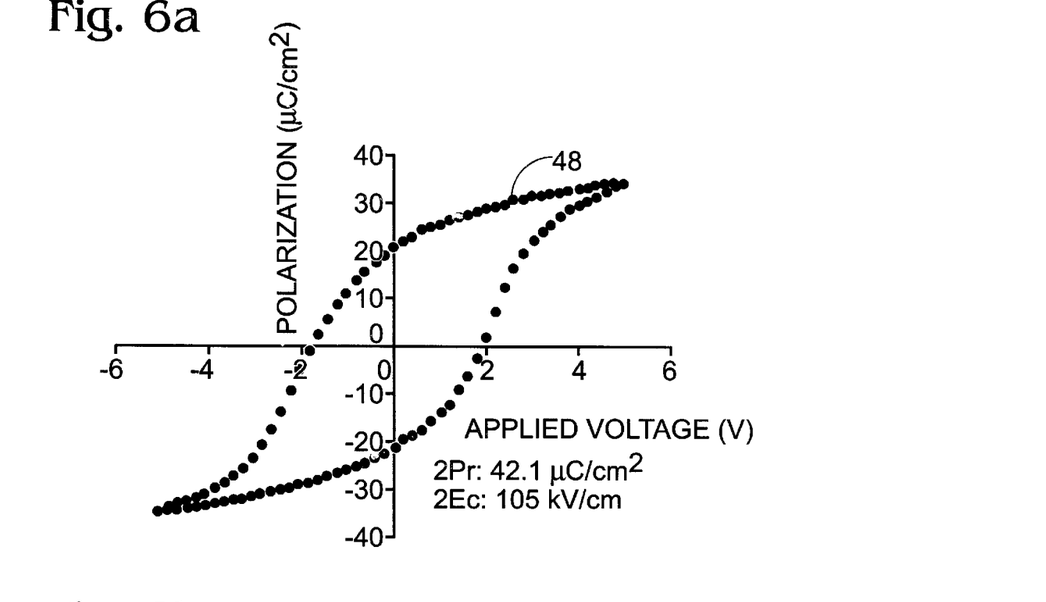
FIG. 6a,b are the hysteresis loops of PZT thin film on Pt/Ir electrodes using solvent III.
Figure 6B:
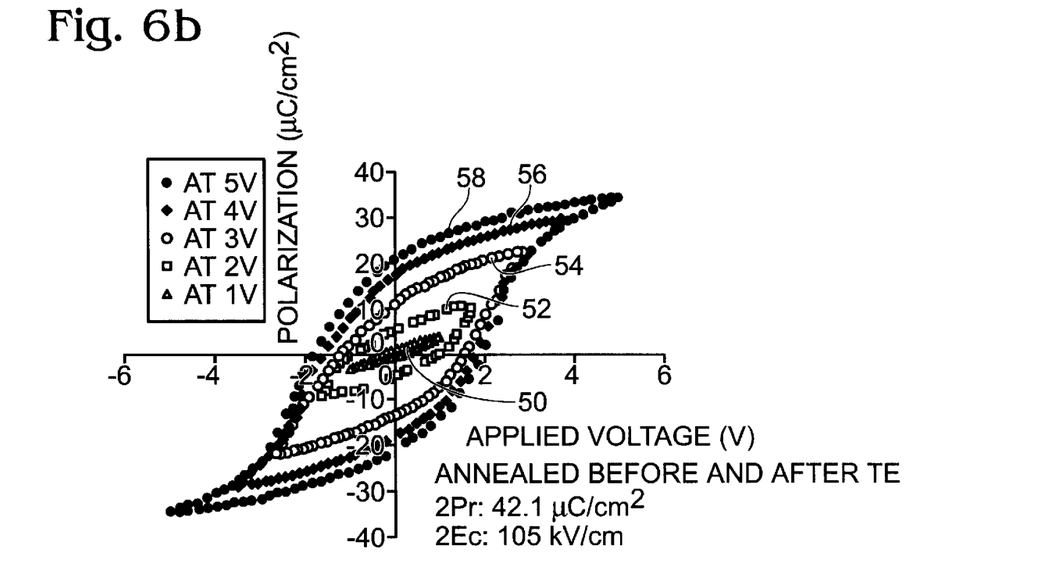

FIGS. 4–6 depict the hysteresis loops of PZT thin films deposited by various solvents. The PZT thin films made using all of the solvents identified herein have very good ferroelectric properties. FIG. 4 depicts the hysteresis loops of PZT thin film on Pt/Ir electrodes using solvent I; FIG. 5 depicts the hysteresis loops of PZT thin film on Pt/Ir electrodes using solvent II; and FIG. 6 depicts the hysteresis loops of PZT thin film on Pt/Ir electrodes using solvent III.

FIG. 4a depicts the hysteresis loop at 5V for a PZT film deposited using solvent I, with annealing before and after top electrode deposition (TE), at 24. The obtained polarization (2Pr) is 43.3 $\mu C/cm^2$, and the coercive field (2Ec) is 107 kv/cm. FIG. 4b depicts the hysteresis loop for the PZT layer with annealing before and after TE, at various applied voltages, wherein trace 26 is the loop for IV, trace 28 is the loop for 2V, trace 30 is the loop for 3V, trace 32 is the loop for 4V, and trace 34 is the loop for 5V.

FIG. 5a depicts the hysteresis loop for a PZT film deposited using solvent II, with annealing before and after TE, at 36. The 2Pr is 39.8 $\mu C/cm^2$, and the 2Ec is 73.2 kv/cm. FIG. 5b depicts the hysteresis loop for the PZT layer with annealing before and after TE, at various applied voltages, wherein trace 38 is the loop for IV, trace 40 is the loop for 2V, trace 42 is the loop for 3V, trace 44 is the loop for 4V, and trace 46 is the loop for 5V.

FIG. 6a depicts the hysteresis loop for a PZT film deposited using solvent III, with annealing before and after TE, at 48. The 2Pr is 42.1 $\mu C/cm^2$, and the 2Ec is 105 kv/cm. FIG. 6b depicts the hysteresis loop for the PZT layer with annealing before and after TE, at various applied voltages, wherein trace 50 is the loop for IV, trace 52 is the loop for 2V, trace 54 is the loop for 3V, trace 56 is the loop for 4V, and trace 58 is the loop for 5V.

Compared with solvent I and III, the best ferroelectric properties are found in the PZT thin film deposited using solvent II. The hysteresis loops with 2Pr value of 39.8 $\mu C/cm^2$ and 2Ec value of 73.2 kv/cm were square and symmetric and almost saturated from a 2V applied voltage.

Figure 7:
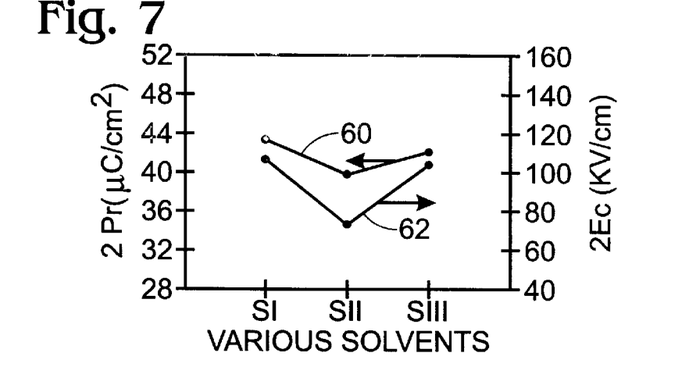
FIG. 7 depicts the obtained polarization and coercive field values of PZT thin films on Pt/Ir electrodes using mixed solvents.
Figure 8:
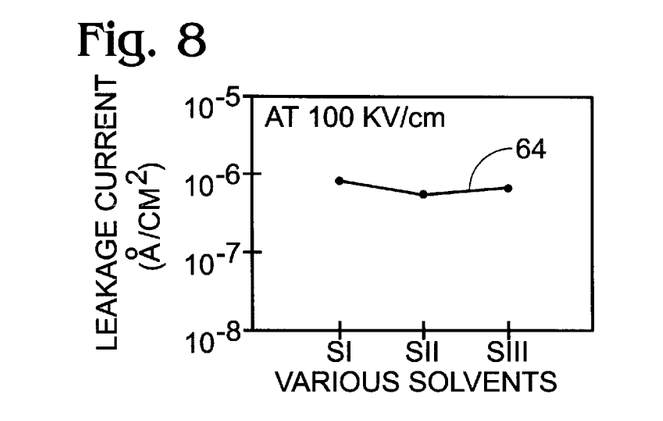
FIG. 8 depicts the leakage currents of PZT on Pt/Ir electrodes using mixed solvents.

FIG. 7 depicts the 2Pr, trace 60, and 2Ec, trace 62, values of PZT thin films on Pt/Ir electrodes using solvents I, II and III. The PZT thin films made by solvent II had the smallest coercive field, 73 kv/cm, and also smallest leakage current, as shown in FIG. 8, which depicts the leakage currents 64 of PZT thin films made using solvents I, II and III.

Although the previously described solvent and precursor combinations provide a PZT film having good ferroelectric characteristics, to be commercially viable, the precursor/solvent combination must have a reasonable shelf life to facilitate manufacture, mixing, transportation and storage prior to use in a MOCVD process. As previously noted, an object of the invention is to provide a stable metal β-diketone precursor. Butyl ether may be used for this purpose. The solid precursors used are $Pb(TMHD)_2$, $Z(OPr^i)_4H(OPr^i)$, $Z(TMHD)_2$, $Ti(OPr^i)_4$ or $Ti(OPr^i)_2(TMHD)_2$, where $OPr^i$ is iso-propoxide ($OCH(CH_3)_2$), and $Ge(OE_t)_4$, where $OE_t$ is ethoxide ($OC_2H_5$), for the preparation of ferroelectric precursors for PZT and PGO ferroelectric and dielectric thin film deposition via MOCVD. The solid precursors are stoimatically mixed and dissolved in a mixture of butyl ether and tetraglyme organic solution, solvent IV. This precursor solution may be used as MOCVD source for the ferroelectric and dielectric thin films deposition.

The precursor solution is stable at room temperature under inert atmosphere over a long time, which means the volatility of solid compounds does not degrade even when they are dissolved in this organic solution over a long time. The precursor solution of the invention did not block the vaporizer over a long time for the PZT thin film deposition, and gave the PZT thin film with good ferroelectric properties, as shown in the FIG. 9.

EXAMPLE ONE

In this example, the solid precursors, $Pb(TMHD)_2$ [3.13 g], $Z(OPr^i)_4H(OPr^i)$ [0.88 g] and $Ti(OPr^i)_4$ [0.65 g], were used at a molar ratio of 1–1.2: 0.3–0.7:0.2–0.7, and preferably at a molar ratio of 1.1:0.5:0.5, and dissolved in a mixture of butyl ether [36.36 g] and tetraglyme [2.42 g], at a molar ratio of 8:1. All of the solid precursors are sublimed before solution preparation. The butyl ether and tetraglyme are used as received from Aldrich. A clear solution is obtained after all of the solid precursors dissolved. The precursor solution was kept in a closed glass bottle for more than one month. The organic solvents, butyl ether and tetraglyme, were then removed by dynamic vacuum at 100° C. The dried solid mixture precursor was heated to about 170° C., for sublimation. More than 95% of the dried solid mixture precursor was found to be volatile. This result indicates that the solid mixture precursor is stable in the organic solution mixture for over one month.

EXAMPLE TWO

Figure 9:
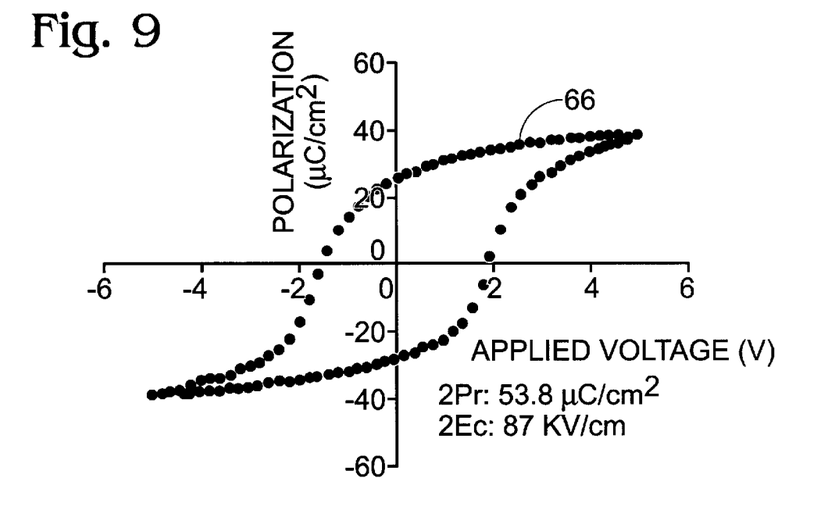
FIG. 9 depicts a hysteresis loop of a PZT thin film, formed using solvent IV, measured under 5V applied voltage.

A PZT thin film was formed using the precursor solution described in Example One, via MOCVD. The PZT precursor solution was delivered into the vaporizer at the flow rate of 0.1 ml/min–0.5 ml/min, and the vaporizer temperature was set between 200° C.–250° C. The reactor pressure was between about 5 Torr–10 Torr, and the deposition temperature was between 550° C.–700° C. High quality PZT thin films were obtained. FIG. 9 depicts a hysteresis loop 66 of the PZT thin film, which was measured under 5V applied voltage, and which achieved a 2Pr of 53.8 $\mu C/cm^2$ and 2Ec of 87 kv/cm.

EXAMPLE THREE
$Pb_5Ge_3O_{11}$ Thin Films

An oxide MOCVD reactor was used for the growth of c-axis oriented $Pb_5Ge_3O_{11}$ thin films. $Pb(THMD)_2$ and $Ge(OE_t)_4$ with a molar ratio of 4–6:2–4, and preferably of about 5:3, were dissolved in a mixed solvent of butyl ether, iso-propanol and tetraglyme in the molar ratio of about 6–9:1–3:1, and preferably of about 8:2:1, solvent II. The precursor solutions had a concentration of 0.1 M/L of PGO. The solution was injected into a vaporizer at 140° C.–180° C. by a pump at a rate of 0.1 ml/min. –0.2 ml/min to form precursor gases. The growth line was 165° C.–245° C. The deposition temperatures and pressure were 300° C.–600° C. and 5 Torr–10 Torr, respectively. The shroud flow, Ar 1000 sccm–6000 sccm, with an oxygen partial pressure of 20%–50%, was led into the reactor. Substrates of Si, $SiO_2$, $Pt/Ti/SiO_2/Si$, Pt—Ir alloy/$Ti/SiO_2/Si$ and $Ir/Ti/SiO_2/Si$ were used for growth of PGO thin films at various deposition times. After PGO film deposition, rapid thermal annealing (RTA) processes were used to improve the ferroelectric and electrical properties of the PGO thin films.

Figure 10:
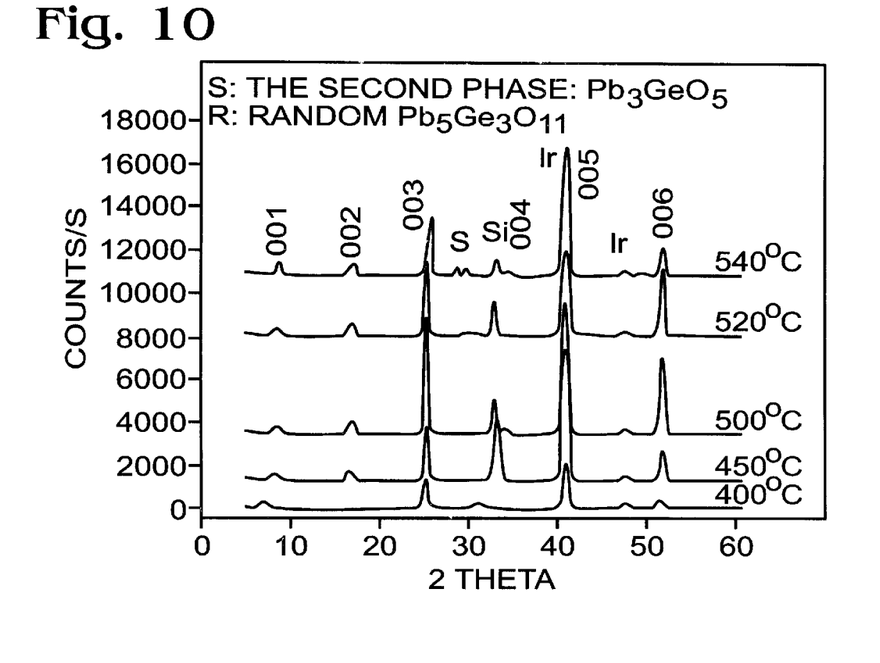
FIG. 10 depicts the X-ray patterns of PGO thin films obtained by the method of the invention.
Figure 11:
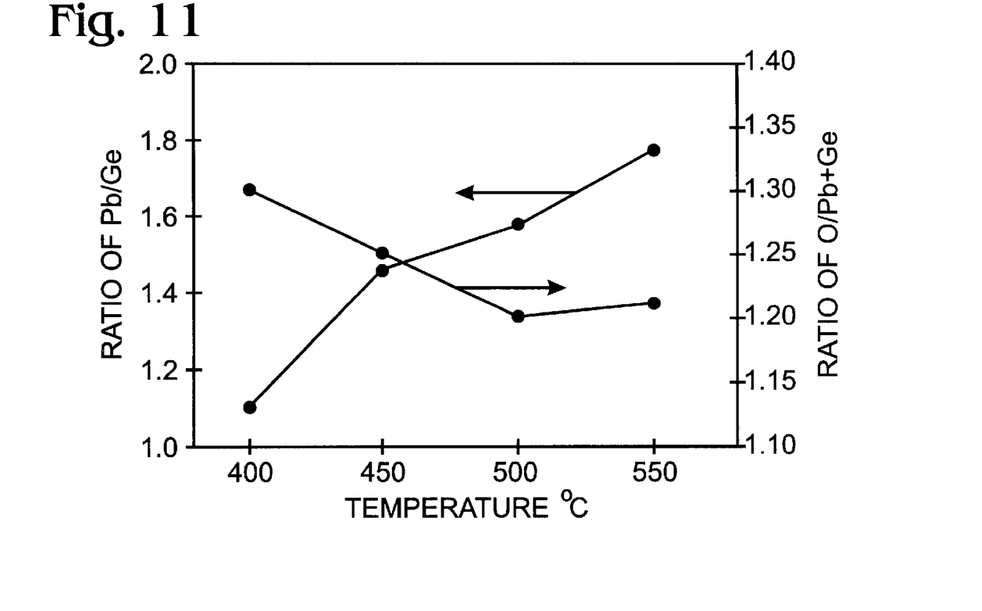
FIG. 11 depicts the composition of PGO thin films.

The experimental results show that c-axis PGO thin films had excellent ferroelectric properties. FIG. 10 depicts the X-ray patterns of $Pb_5Ge_3O_{11}$ films deposited on Ir substrates from 400° C. to 550° C. The nucleation of c-axis oriented PGO phase began at a deposition temperature below 400° C. As the substrate temperature increased, the grain growth and c-axis oriented PGO film occurred. The very sharp peaks, (001), (002), (003), (004), (005), and (006), were observed from PGO thin films at a substrate temperature of about 500° C., which indicated the formation of a well-crystallized $Pb_5Ge_3O_{11}$ film having the preferred c-axis orientation. At temperatures in excess of 500° C., a small second phase $Pb_3GeO_5$ layer was formed, which increased as the substrate temperature increased. The intensity of the c-axis peaks decreased with increasing this phase of $Pb_3GeO_5$. From the composition analysis shown in FIG. 11, the Pb content increased and the Ge content decreased as the substrate temperature increased during MOCVD.

Figure 12:
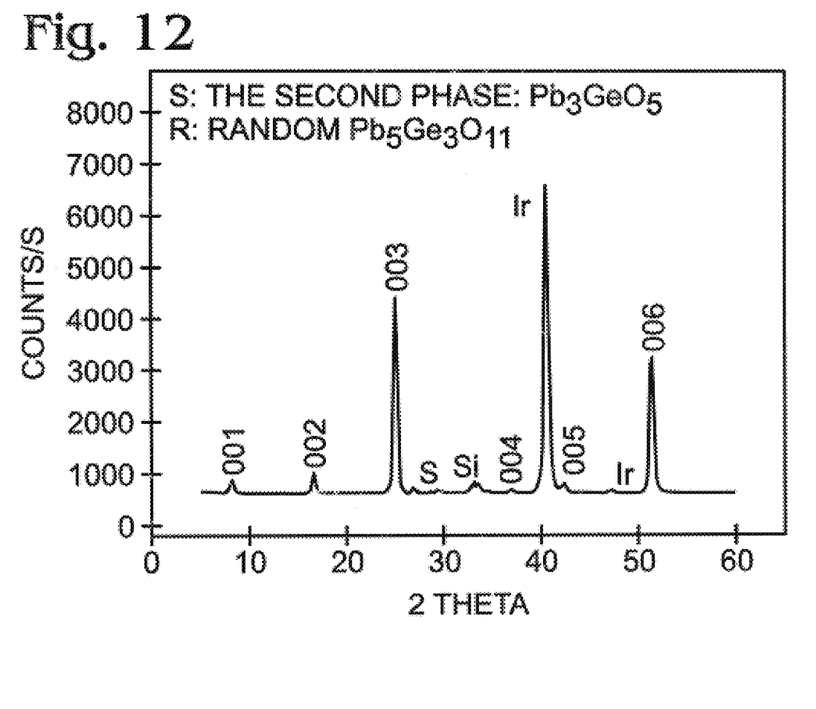
FIG. 12 depicts the X-ray pattern of PGO thin films made with multiple MOCVD and annealing.
Figure 13:
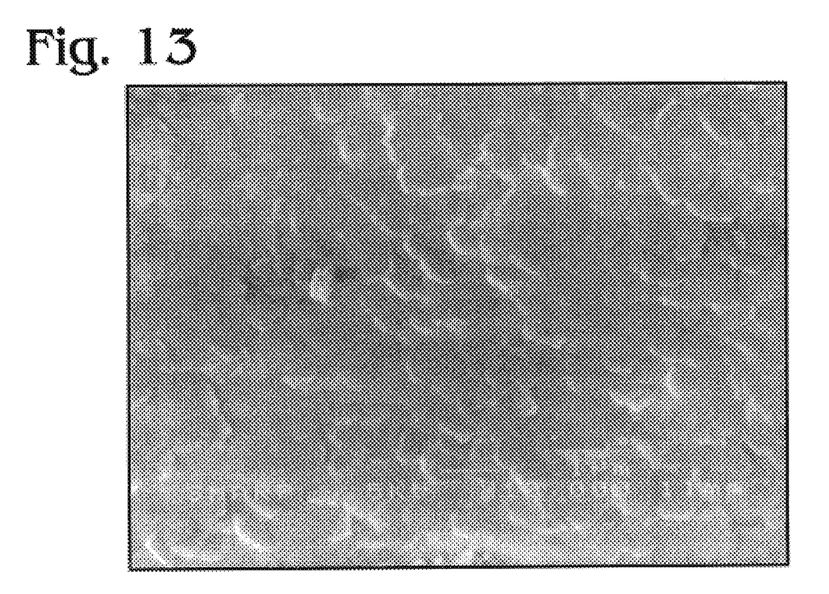
FIG. 13 depicts the microstructure of c-axis oriented PGO thin films made using multiple MOCVD and annealing.

The stoichiometrical $Pb_5Ge_3O_{11}$ thin films were obtained at substrate temperature of about 500° C., which is consistent with X-ray analysis results, shown in FIG. 12. The PGO thin film has a high c-axis orientation of $Pb_5Ge_3O_{11}$, with a little of the second phase $Pb_3GeO_5$. FIG. 13 depicts the microstructure of c-axis oriented PGO thin films using the multiple MOCVD and annealing processes. The average grain size of the PGO film is about 0.8 mm. The layered structure confirmed that the c-axis oriented PGO thin films grew layer-by-layer along the c-axis direction. The thickness of PGO thin film was measured to be about 300 nm.

Figure 14:
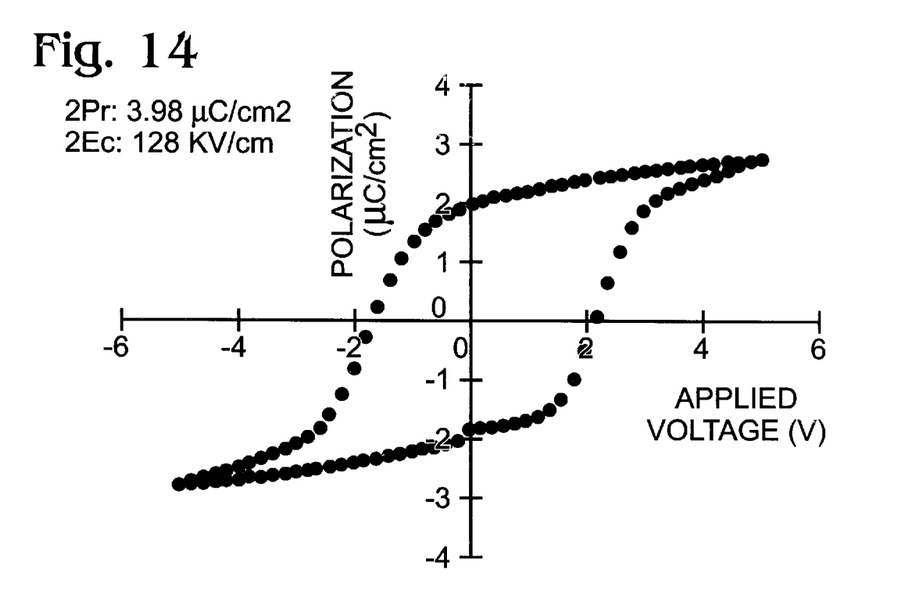
FIG. 14 depicts the hysteresis loop of a PGO thin film at 5V.
Figure 15:
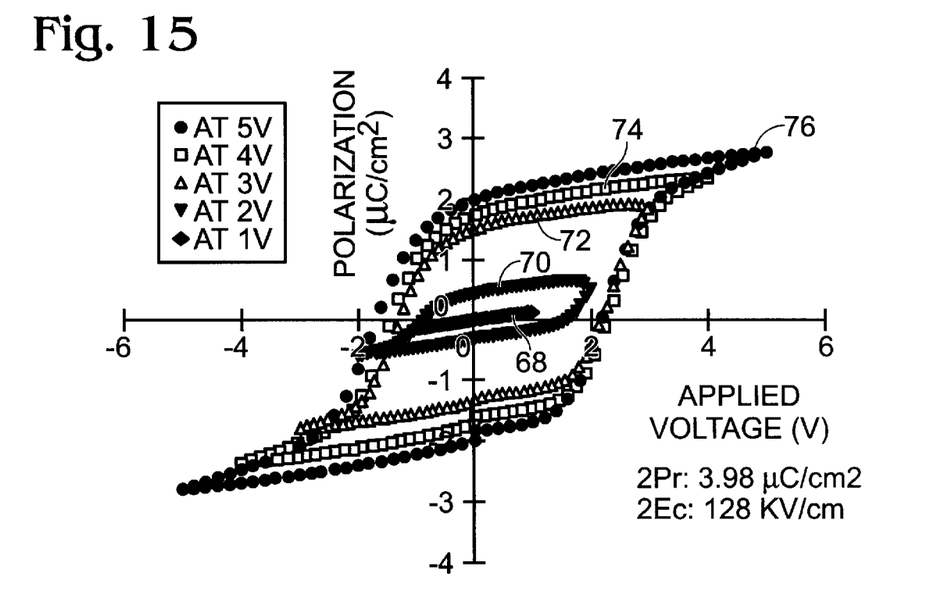
FIG. 15 depicts the hysteresis loop of a PGO thin film at various voltages.

PGO thin films made by MOCVD and annealing processes exhibited very good ferroelectric and electrical properties. FIG. 14 depicts the hysteresis loop of such a PGO thin film, which is square, symmetrical and well saturated, at an applied voltage of 5 V. The 2Pr is 3.98 $\mu C/cm^2$, and the 2Ec is 128 KV/cm. FIG. 15 depicts the hysteresis loops of the PGO thin films at 1V, trace 68, 2V, trace 70, 3V, trace 72, 4V, trace 74, and 5V, trace 76. The hysteresis loops of the PGO thin film were nearly saturated above 3V.

Figure 16:
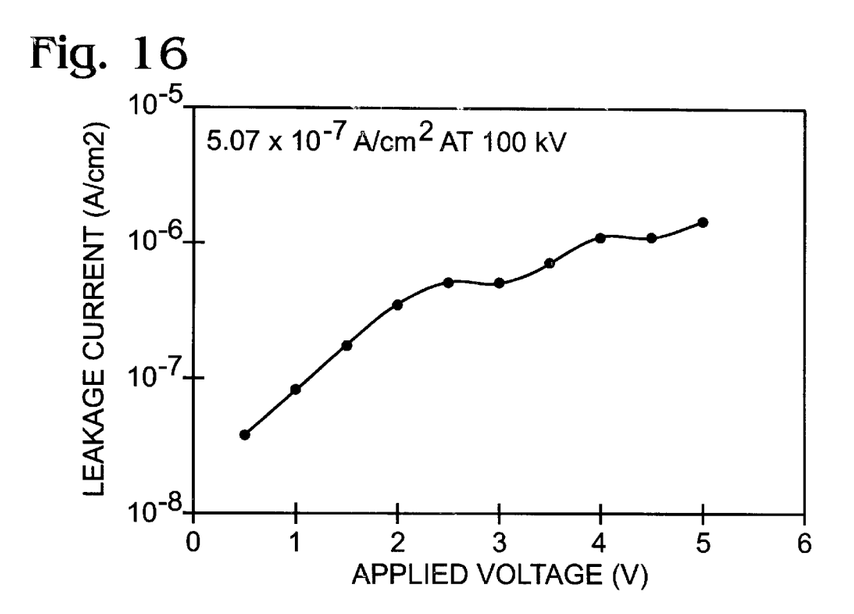
FIG. 16 depicts the leakage current of a PGO thin film.

Low leakage current density is an important consideration for memory device applications. FIG. 16 depicts the I-V curve of a 300-nm thick MOCVD PGO film. Excellent I-V characteristics were observed. The leakage current density of the $Pb_5Ge_3O_{11}$ thin film increased with increasing applied voltage, and is about $5.07 \times 10^{-7}$ $A/cm^2$ at 100 KV/cm.

Figure 17:
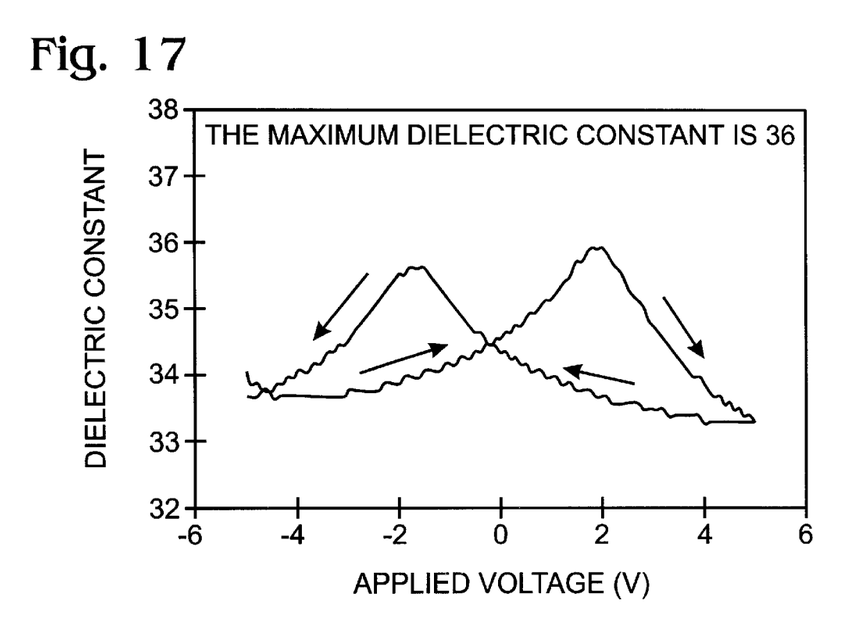
FIG. 17 depicts the dielectric constant of a PGO thin film.

The dielectric constant is another important issue for memory devices, especially in one-transistor memory applications. The dielectric constant of $Pb_5Ge_3O_{11}$ thin films shows behavior similar to most ferroelectric materials, that is, the dielectric constant changes with applied voltage. The maximum dielectric constant of the $Pb_5Ge_3O_{11}$ thin film is about 36, as shown in FIG. 17.

EXAMPLE FOUR
$Ba_{1-x}Sr_xTiO_3$ Thin Films

The BST films were prepared on $Pt/Ti/SiO_2/Si$ substrates by MOCVD. Typical process conditions are as shown in Table 2. Bis(2,2,6,6-tetramethyl-3,5-heptanedionato) strontium hydrate [$Sr(TMHD)_2$], Bis(2,2,6,6-tetramethyl-3,5-heptanedionato) barium hydrate [$Ba(TMHD)_2$], and Titanium i-propoxide [$Ti(OPr^i)4$](TIP) were used as starting materials. For the liquid-delivery system, the $Ba(TMHD)_2$, $Sr(TMHD)_2$ and TIP were dissolved in a solution of tetrahydrofuran, 2-ethyl-1-hexanol, and tetraglyme with the molar ratio 6–9:1–3:1, a variation of solvent I, to form a source solution with a concentration of 0.1 M–0.3 M. The source solution was pumped into a heated vaporizer at 220° C.–250° C. at a rate of 0.2 ml/min–0.6 ml/min.

The mixed precursor vapors were carried into the reactor with preheated nitrogen at 220° C.–250° C. After deposition, the BST films were cooled to room temperature in an oxygen atmosphere. Smooth and specular BST films were obtained. The composition of the BST thin films was analyzed by using energy dispersion X-ray analysis (EDX) and Rutherford back scattering (RBS). The BST thickness and thickness uniformity were measured by a UVIVIS spectrometer. The phases of the films were identified using X-ray diffraction (XRD).

The surface morphologies and surface roughness of BST films on Pt/Ti/SiO$_2$/Si substrates were measured by Atomic Force Microscopy (AFM). The optical properties of the BST films on Pt/Ti/SiO$_2$/Si substrates were measured by both UV-VIS-NIR spectrophotometry, and variable angle spectroscopic ellipsometry. The ferroelectric properties were measured using a standardized RT66A tester. The top electrodes were sputtered platinum using a shadow mask. The area of the top electrode was $2.1 \cdot 10^{-4}$ cm$^2$. Leakage currents were measured using Keithley 617 programmable electrometer. At each stage, the current was measured once by applying the field, such that the top electrode is the higher potential (Top-High) and then by reversing the field (Top-Low). The dielectric constant was measured as a function of frequency and also bias voltage, using a HP 4192A LF impedance analyzer.

The films were deposited at temperatures ranging from 500° C. to 750° C. As-deposited films were specular, crack-free, uniform, and adhered well to the substrates. These films showed very smooth surfaces as viewed by both optical microscopy and atomic force microscopy. The experimental results demonstrate that BST crystalline phase formation was initiated at 600° C.–650° C. and was complete at a temperature of 700° C. The XRD patterns of the as-deposited BST films on Pt/Ti/SiO$_2$/Si substrates at 700° C. were measured. The major XRD peaks corresponding to (100), (200), (110), (210), (211) planes, were observed and demonstrate that the single BST phase is formed. The microstructure of the films was found to be dense and homogenous. Under AFM examination, the film's surface morphology appeared uniformly distributed, fine grained and crack-free. The average grain size was approximately 100 nm for films deposited at 700° C. The refractive index of the films was near 2.2, at a wavelength of 640 nm, measured by variable angle spectroscopic ellipsometry. This value is very close to that of bulk BST samples, which indicates formation of a highly dense film.

For high density DRAM application, the dielectric constant is a critical parameter. The frequency dependence of the dielectric constant exhibits a monotonic decrease with increasing frequency. From 200 kHz to 1000 kHz, the dielectric constant value tends to be stable at about 600. Low leakage current density is another important consideration for memory device applications. Excellent I-V characteristics were observed. The leakage current density at 100 kv/cm was approximately $2.0 \cdot 10^{-7}$ A/cm$^2$. Under the same conditions of an applied electric field, the leakage current resulting from random polycrystalline BST thin films are similar to those from heteroepitaxial BST thin films.

EXAMPLE FIVE

SrBi$_2$Ta$_2$O$_9$ (SBT) Thin Films

The SBT films were prepared on Pt/Ti/SiO$_2$/Si substrates by MOCVD. The films were deposited at the desired temperature directly, or were deposited at low temperature for nucleation, and then post-annealed at a higher temperature for crystallization. For SBT thin films, Bis(2,2,6,6-tetramethyl-3,5-heptanedionato) strontium hydrate [Sr(TMHD)$_2$], triphenylbismuth [Bi(C$_6$H$_5$)$_3$], tantalum ethoxide [Ta(OC$_2$H$_5$)$_5$] were used as starting materials with mixture of molar ratio of tetrahydrofuran (6–10), toluene, xylene, butyl acetate or iso-propanol (1–4) and tetraglyme (1–2), as the solvents. The organic precursors were mixed and dissolved in the solvents to form a source solution with a concentration of 0.1–0.5 M/L of SBT. The source solution was injected at a rate of 0.1 ml/min–0.5 ml/min by a liquid pump into the heated vaporization chamber at a temperature of about 220° C.–250° C., to form a precursor gas. The mixed precursor gases were brought into reactor chamber at temperature of 550–650° C. using preheated nitrogen flow at 220–250° C. The oxygen was separately fed into the reactor chamber. The precursor gas went through a by-pass line for approximately three minutes before starting deposition. After deposition, the SBT films were cooled to room temperature in a oxygen atmosphere. The thickness of the SBT films was about 100 nm–200 nm. The top electrodes were sputtered platinum using a shadow mask. The area of the top electrode was $2.1 \times 10^{-1}$ cm$^2$. It was found that nucleation of SBT started at a deposition temperature close to 500° C. and grain growth dominated at 700° C. or above. With increasing deposition temperature, the grain size of SBT thin films increased from 100 nm 200 nm. High quality SBT thin films were obtained.

The SBT thin films with grain size about 100 nm exhibit the following properties: thickness of about 16 nm–190 nm; 2Pr of about 7.8 mC/cm$^2$–11.4 mC/cm$^2$ at 5V; EC of about 50 kv/cm–65 kv/cm; leakage current of about $8.0 \cdot 10^{-9}$ A/cm$^2$–$9.5 \cdot 10^{-9}$ A/cm$^2$ at 150 kv/cm; dielectric constant of about 100–200; and fatigue rate of about 0.94–0.98 after $10^9$ cycles at 5 V.

Thus, a method for MOCVD ferroelectric and dielectric thin film depositions using mixed solvents has been disclosed. It will be appreciated that further variations and modifications thereof may be made within the scope of the invention as defined in the appended claims.

We claim:

1. A source solution for use in chemical vapor deposition processes comprising:
   a ferroelectric chemical vapor deposition precursor which is a combination of Pb(TMHD)$_2$ and Ge(OE$_t$)$_4$ in a molar ratio of about 5:3 having a concentration of about 0.1 M/L; and
   a solvent for carrying said ferroelectric chemical vapor deposition precursor taken from the group of solvents consisting of type A solvents, taken from the group of solvents consisting of tetraglyme, triglyme, triethylenetetramine, N,N,N',N',-tetramethylethylenediamine; N,N,N',N',N'',N''-pentamethyldiethylenetriamine; and 2,2'-bipyridine; type B solvents taken from the group of solvents consisting of tetrahydrofuran, butyl ethyl ether, tert-butyl ethyl ether, butyl ether, and pentyl ether; and type C solvents taken from the group of solvents consisting of iso-propanol, 2-butanol, 2-ethyl-1-hexanol, 2-pentanol, toluene, xylene and butyl acetate; and mixtures of solvent types A, B and C.

2. The source solution of claim 1 wherein said solvent is a mixture of tetrahydrofuran, iso-propanol and tetraglyme in a molar ratio of about 6–10:1–4:1.

3. The source solution of claim 1 wherein said solvent is a mixture of butyl ether, iso-propanol and tetraglyme in a molar ratio of about 6–10:1–4:1 and preferably of about 8:2:1.

4. The source solution of claim 1 wherein said solvent is a mixture of butyl ether, tetrahydrofuran, iso-propanol and tetraglyme in a molar ratio of about 3–5:3–5:1–4:1 and preferably of about 4:4:2:1.

5. The source solution of claim 1 wherein said solvent is a mixture of butyl ether and tetraglyme in a molar ratio of about 6–10:1–3, and preferably in a molar ratio of 8:1.

6. A source solution for use in chemical vapor deposition processes comprising:

a ferroelectric chemical vapor deposition precursor which is a combination of Pb(TMHD)$_2$ and Ge(OE$_t$)$_4$ in a molar ratio of about 5:3; and a solvent for carrying said ferroelectric chemical vapor deposition precursor taken from the group of solvents consisting of type A solvents, taken from the group of solvents consisting of tetraglyme, triglyme, triethylenetetramine, N,N,N',N'-tetramethylethylenediamine; N,N,N',N',N'',N''-pentamethyldiethylenetriamine; and 2,2'-bipyridine; type B solvents taken from the group of solvents consisting of tetrahydrofuran, butyl ethyl ether, tert-butyl ethyl ether, butyl ether, and pentyl ether; and type C solvents taken from the group of solvents consisting of iso-propanol, 2-butanol, 2-ethyl-1-hexanol, 2-pentanol, toluene, xylene and butyl acetate; and mixtures of solvent types A, B and C, wherein said ferroelectric chemical vapor deposition precursor has a concentration of about 0.1 M/L in said solvent.

7. The source solution of claim 6 wherein said solvent is a mixture of tetrahydrofuran, iso-propanol and tetraglyme in a molar ratio of about 8:2:1.

8. The source solution of claim 6 wherein said solvent is a mixture of butyl ether, iso-propanol, and tetraglyme in a molar ratio of about 6–10:1–4:1 and preferably of about 8:2:1.

9. The source solution of claim 6 wherein said solvent is a mixture of butyl ether, tetrahydrofuran, iso-propanol and tetraglyme in a molar ratio of about 3–5:3–5:1–4:1 and preferably of about 4:4:2:1.

10. The source of claim 6 wherein said source is a ferroelectric source solution and wherein said solvent is a mixture of butyl ether and tetraglyme in a molar ratio of about 6–10:1–3, and preferably in a molar ratio of about 8:1.

11. A ferroelectric and dielectric source solution for use in chemical vapor deposition processes comprising:

a ferroelectric/dielectric chemical vapor deposition precursor consisting essentially of Pb(TMHD)$_2$ and Ge(OE$_t$)$_4$ in a molar ratio of about 5:3; and a mixed solvent for carrying said ferroelectric/dielectric chemical vapor deposition precursor taken from the group of mixed solvents consisting of type A solvents, taken from the group of solvents consisting of tetraglyme, triglyme, triethylenetetramine, N,N,N',N'-tetramethylethylenediamine; N,N,N',N',N'',N''-pentamethyldiethylenetriamine; and 2,2'-bipyridine; type B solvents taken from the group of solvents consisting of tetrahydrofuran, butyl ethyl ether, tert-butyl ethyl ether, butyl ether, and pentyl ether; and type C solvents taken from the group of solvents consisting of iso-propanol, 2-butanol, 2-ethyl-1-hexanol, 2-pentanol, toluene, xylene and butyl acetate; and mixtures of solvent types A, B and C, in a molar ratio of about 1:6–10:1–4, and a mixture consisting of solvent types A and B, in a molar ratio of about 1–3:6–10, wherein said ferroelectric/dielectric chemical vapor deposition precursor has a concentration of about 0.1 M/L in said solvent.

* * * * *